Oct. 4, 1966 HIROE OSAFUNE ETAL 3,277,351

METHOD OF MANUFACTURING SEMICONDUCTOR DEVICES

Filed Feb. 7, 1963

INVENTORS
HIROE OSAFUNE
TETSURO NAKAMURA
BY
Haseltine & Calimafde
ATTORNEYS 3,277,351

METHOD OF MANUFACTURING SEMICONDUCTOR DEVICES

Hiroe Osafune and Tetsuro Nakamura, Tokyo, Japan, assignors to Nippon Electric Company Limited, Tokyo, Japan, a corporation of Japan Filed Feb. 7, 1963, Ser. No. 257,000
Claims priority, application Japan, Feb. 10, 1962, 37/5,076
2 Claims. (Cl. 317—234)

This invention relates to a method of manufacturing semiconductor devices such as diodes, transistors, and the like. The invention is characterized by a novel method of producing P-N junctions which have low forward resistance values and high reverse voltage breakdown values.

In semiconductor devices, it is desirable to have P-N junctions with low forward resistance to minimize power dissipation and signal attenuation within the semiconductor. It is equally desirable for the P-N junctions to have high reverse voltage breakdown values to enhance the operating range of the semiconductor device. Unfortunately, these two characteristics are incompatible in ordinary semiconductor devices because forward resistance and reverse voltage breakdown are directly related in simple P-N junctions, i.e., the reverse voltage breakdown is low when the forward resistance is low and high when the forward resistance is high. It has been found in the prior art, however, that low resistance high breakdown voltage P-N junctions can be formed by growing a thin high resistance crystal layer onto a low resistance semiconductor substrate of the same conductivity type and then diffusing a low resistance region of the opposite conductivity type into the grown crystal layer. In accordance with further prior art technique, the high resistance crystal layer was formed by growing semiconductor crystals from the gas phase, and the low resistance region of opposite conductivity type was formed by the prior art alloying method. These grown junctions were an improvement over simple P-N junctions, but they had several serious drawbacks that were associated with crystal imperfections in the grown crystal layer. When a crystallized layer is grown onto a substrate from the gas phase, a relatively high percentage of crystal imperfections are formed in the grown layer adjacent to the substrate. When impurities are diffused into the grown layer to form the region of opposite conductivity type, the crystal imperfections cause an abnormal distribution of impurities, which in turn degrades the electrical characteristics of the junction. In addition, impurities are diffused out of the low resistance crystal substrate into the grown layer during the heating process, i.e., diffusion process, etc., thereby adding to the abnormal impurity distribution and further degrading the electrical characteristics of the junction. The degradation is particularly severe in high power semiconductor devices, which have a large junction area and consequently a large number of crystal imperfections in the grown layer.

Accordingly, one object of this invention is to provide in a semiconductor material an improved PN junction which has a relatively low forward resistance and a relatively high reverse voltage breakdown value.

Another object of this invention is to provide a PN junction of the above noted type which avoids the undesirable effects of crystal imperfections in the semiconductor material.

A further object of the invention is to provide a method of producing PN junctions of the above noted type.

Other objects and advantages of the invention will be apparent to those skilled in the art from the following description of several specific embodiments thereof, as illustrated in the attached drawings, in which.

Figures 1A, 1B, 1C, 1D, 1E, 1F, 1G, 2, 3A, 3B, 3C:
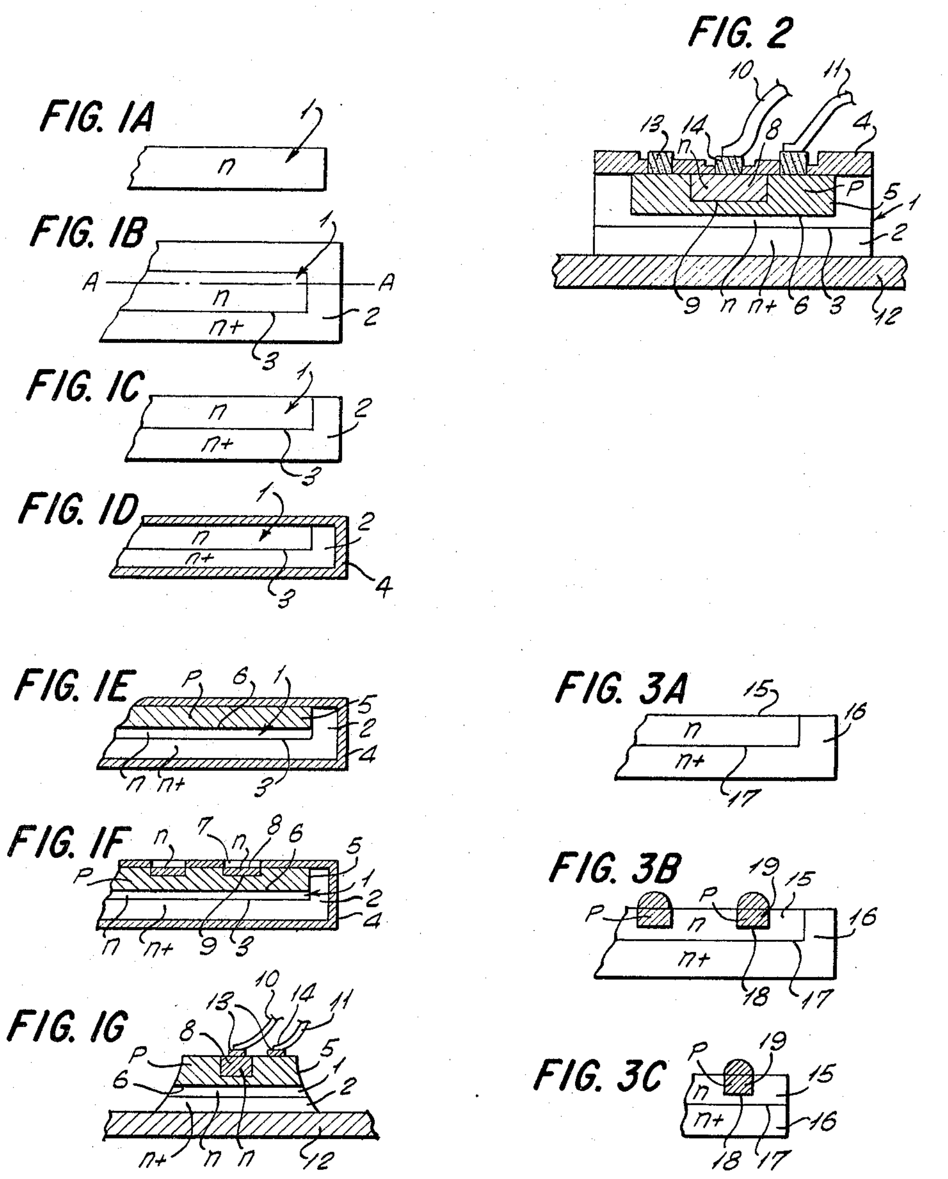
FIG. 1A shows the first step in manufacturing an NPN transistor in accordance with the method of this invention.
FIG. 1B shows the second step in manufacturing an NPN transistor in accordance with the method of this invention.
FIG. 1C shows the third step in manufacturing an NPN transistor in accordance with the method of this invention.
FIG. 1D shows the fourth step in manufacturing an NPN transistor in accordance with the method of this invention.
FIG. 1E shows the fifth step in manufacturing an NPN transistor in accordance with the method of this invention.
FIG. 1F shows the sixth step in manufacturing an NPN transistor in accordance with the method of this invention.
FIG. 1G shows the seventh step in manufacturing an NPN transistor in accordance with the method of this invention.
FIG. 2 is an elevation section of a second NPN transistor of this invention.
FIG. 3A shows the first step in manufacturing a diode in accordance with the method of this invention.
FIG. 3B shows the second step in manufacturing a diode in accordance with the method of this invention.
FIG. 3C shows the third step in manufacturing a diode in accordance with the method of this invention.

In general terms, the method of this invention comprises growing a relatively low resistance crystal layer on a relatively high resistance semiconductor substrate and then diffusing a low resistance region of opposite conductivity type into the substrate near the boundary of the substrate and the grown layer. This method differs from the prior art method in that the semiconductor substrate is a relatively high resistance material rather than a relatively low resistance material, and in that impurities are diffused into the substrate to form the region of opposite conductivity type rather than into the grown layer. These differences produce a PN junction which has a low forward resistance, a high reverse breakdown voltage value, and which is free from any degrading effect of imperfections in the grown crystal layer. The method of this invention does not eliminate the imperfections in the grown crystal layer, but it avoids the degrading effect of these imperfections by forming the PN junction in the crystal substrate, which is relatively free from imperfections, rather than in the grown layer, which is not.

The method of this invention can be more clearly understood in connection with FIGS. 1A through 1G, which illustrate the process of manufacturing an NPN silicon mesa transistor in accordance with the method of this invention. Referring to FIG. 1A, a single silicon crystal wafer 1 is used as a substrate material. In this example, wafer 1 is N type silicon having a resistivity of 5 ohms-centimeter. The first step of the manufacturing process is to clean the surface of wafer 1 by mechanical polishing and chemical treatment so that a crystal layer can be grown onto the substrate from the gas phase. This can be done in accordance with any suitable prior art cleaning technique. The next step is to grow a relatively low resistance N type silicon layer onto the substrate (layer 2 in FIG. 1B). This can be done, for example, by heating substrate 1 in an atmosphere of desiccated hydrogen and then growing the substrate from the gas phase in accordance with the known prior art techniques. Grown layer 2 is preferably several scores of microns in thickness, and its resistance is preferably less than 0.001 ohm-centimeter. The next step is to remove the grown crystal layer from one side of substrate 1 to expose the substrate material, as shown in FIG. 1C. This can be done by mechanical or chemical means. Alternately, the grown layer 2 can be grown on only one side of the substrate 1. In the latter case, of course, it will not be necessary to remove any of the grown layer, since one side of the substrate will be bare. The next step is to grow an oxide film 4 (FIG. 1D) over the substrate and grown layer by heating them in the presence of an oxidizing gas current. Oxide film 4 is preferably around one micron in thickness. In the next step, a P type impurity such as gallium is diffused through oxide film 4 into substrate material 1 to form a P type region 5 (FIG. 1E) which forms a PN junction 6 with the N type material of substrate 1. In the diffusion operation, the temperature and time of diffusion are preferably controlled so that PN junction 6 is spaced from the boundary 3 of substrate 1 and grown layer 2 by a distance of 1 or 2 microns. This provides the desired combination of low forward resistance and high reverse voltage break down for the PN junction 6. At this point it should be noted that the material shown in FIG. 1E could be used as a diode by simply attaching one terminal to P type region 5 and another terminal to the N type region 2. For a transistor however, it is necessary to form another PN junction, which is done by etching holes 7 (FIG. 1F) in oxide coating 4 and diffusing an N type impurity such as phosphorous into P type regions 5 to form N type regions 8 which provide a second PN junction 9. In the next step, the wafer is cut into pieces with one of the N type regions 8 in each piece, thereby forming a plurality of NPN transistor bodies. The transistor bodies are finished by etching away the oxide film, attaching grown layer 2 to a collector electrode 12, and attaching an emitter electrode 13 and a base electrode 14 to regions 8 and 5 respectively, as shown in FIG. 1G. In the finished transistor, the collector-base junction 6 will have the desirable combination of low forward resistance and high reverse voltage breakdown without the undesirable effect of crystal imperfections in grown layer 2.

The invention, of course, is not limited in its application to the manufacture of silicon mesa transistors such as illustrated in FIGS. 1A through 1G. It can also be used in the manufacture of silicon planar transistors (FIG. 2), germanium diodes (FIGS. 3A through 3C), or any other semiconductor device that contains a PN junction. The silicon planar transistor shown in FIG. 2 is produced by the process illustrated in FIGS. 1A through 1G, with the exception of P type region 5′, which is produced by the diffusion of boron rather than gallium into the substrate 1. FIG. 3A shows a substrate 15 of N type germanium on which has been grown a crystallized layer of low resistance germanium 16 by the process illustrated in FIGS. 1A through 1C. The material of substrate 15 has a resistance of 10 ohms-centimeter and the grown layer 16 has a resistance less than 0.001 ohm-centimeter. P type regions 19 (FIG. 3B) are then diffused into substrate 15 by alloying pellets of indium to the exposed surface thereof. As in the other embodiments of the invention, the temperature and time of the alloying process is controlled so that the junction 18 between P type region 19 and N type region 15 falls within one or two microns of the boundary 17 between substrate 15 and grown layer 16. The semiconductor material is then cut into pieces with one of the P type regions 19 in every piece to form a plurality of diode bodies. The individual diode bodies (FIG. 3C) are then finished by attaching electrodes to P type region 19 and N type region 16. The electrodes are not shown in the drawings, but their structure will be obvious to those skilled in the art.

From the foregoing description it will be apparent that this invention provides a method of manufacturing PN junctions which have improved characteristics over those heretofore known in the art. It will also be apparent that this invention provides a grown PN junction which avoids the degrading effect of crystal imperfections in the grown layer thereof. And it should be understood that this invention is by no means limited to the specific embodiments disclosed herein by way of example. Many modifications can be made in the disclosed structure, and this invention includes all modifications falling within the scope of the following claims.

We claim:

1. A semiconductor device comprising a semiconductor substrate member, a layer of semiconductor material grown from the gas phase onto said substrate member, said layer of semiconductor material having the same conductivity type as said substrate member and being lower in resistivity, a region of opposite conductivity type formed within said substrate member near the boundary between said substrate member and said grown layer, said boundary comprising a PN junction and said junction being spaced from the boundary between said substrate member and said grown layer by a distance generally of the order of 0–2 microns, whereby said device has the improved characteristics of lower forward resistance and a higher reverse voltage breakdown value.

2. A semiconductor device as defined in claim 1 wherein the resistivity of said substrate member is in the order of 10 ohms-centimeter and the resistivity of said grown layer is in the order of 0.001 ohm-centimeter.

References Cited by the Examiner

UNITED STATES PATENTS

| | | | |
|---|---|---|---|
| 2,857,527 | 10/1958 | Pankove | 317—235 |
| 2,908,871 | 10/1959 | McKay | 317—235 |
| 2,985,804 | 5/1961 | Buie | 317—235 |
| 3,131,098 | 4/1964 | Krsek et al. | 317—235 |
| 3,159,780 | 12/1964 | Parks | 317—235 |
| 3,196,327 | 7/1965 | Dickson | 317—235 |
| 3,200,018 | 8/1965 | Grossman | 148—175 |

OTHER REFERENCES

IBM Technical Bulletin, vol. 5, No. 2, July 1962, by Doo et al., "Growing High Resistivity Epitaxial Films on Low Resistivity Silicon Substrats."

JOHN W. HUCKERT, *Primary Examiner.*

J. D. CRAIG, *Assistant Examiner.*